(12) United States Patent
Moriwaki

(10) Patent No.: US 8,797,786 B2
(45) Date of Patent: Aug. 5, 2014

(54) STATIC RAM

(75) Inventor: Shinichi Moriwaki, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/226,726

(22) Filed: Sep. 7, 2011

(65) Prior Publication Data

US 2012/0127782 A1    May 24, 2012

(30) Foreign Application Priority Data

Nov. 22, 2010   (JP) .................................. 2010-260338

(51) Int. Cl.
| | | |
|---|---|---|
| G11C 11/00 | (2006.01) | |
| G11C 11/413 | (2006.01) | |
| G11C 11/412 | (2006.01) | |
| G11C 11/41 | (2006.01) | |
| G11C 11/418 | (2006.01) | |
| G11C 8/08 | (2006.01) | |
| G11C 11/419 | (2006.01) | |
| G11C 7/18 | (2006.01) | |
| G11C 8/14 | (2006.01) | |

(52) U.S. Cl.
CPC ............ *G11C 11/413* (2013.01); *G11C 11/412* (2013.01); *G11C 11/41* (2013.01); *G11C 11/418* (2013.01); *G11C 8/08* (2013.01); *G11C 11/419* (2013.01); *G11C 7/18* (2013.01); *G11C 8/14* (2013.01)
USPC ................. 365/154; 365/230.05; 365/230.06; 365/189.15

(58) Field of Classification Search
USPC ........................................... 365/154, 230.05
See application file for complete search history.

(56) References Cited

U.S. PATENT DOCUMENTS

| | | | |
|---|---|---|---|
| 6,091,629 A * | 7/2000 | Osada et al. .................. | 365/156 |
| 6,741,487 B2 | 5/2004 | Yokozeki | |
| 7,385,865 B2 * | 6/2008 | Khellah et al. ................ | 365/203 |
| 7,663,942 B2 * | 2/2010 | Kushida ........................ | 365/191 |
| 8,000,130 B2 * | 8/2011 | Kushida ........................ | 365/154 |
| 2006/0062061 A1 * | 3/2006 | Suh et al. ...................... | 365/203 |

FOREIGN PATENT DOCUMENTS

| | | |
|---|---|---|
| JP | H01-241093 | 9/1989 |
| JP | 2003-151280 A2 | 5/2003 |

OTHER PUBLICATIONS

Related U.S. Appl. No. 13/561,420.*
U.S. Appl. No. 13/561,420, filed Jul. 30, 2012; inventor: Moriwaki, Shinichi.*

* cited by examiner

*Primary Examiner* — Kretelia Graham
(74) *Attorney, Agent, or Firm* — Fujitsu Patent Center

(57) ABSTRACT

A static RAM includes a plurality of word lines, a plurality of global bit line pairs, a plurality of static-type memory cells, a plurality of sense amplifiers, a plurality of local bit line pairs provided in correspondence with each global bit line pair, and a plurality of global switches, wherein the plurality of static-type memory cells is connected to the corresponding local bit line pair in response to a row selection signal, and at the time of read, the row selection signal is applied to the word line and after the corresponding local bit line pair is brought into a state corresponding to contents stored in the memory cell, application of the row selection signal is stopped and then the corresponding global switch is brought into a connection state and after changing the state of the global bit line pair, the corresponding sense amplifier is operated.

2 Claims, 7 Drawing Sheets

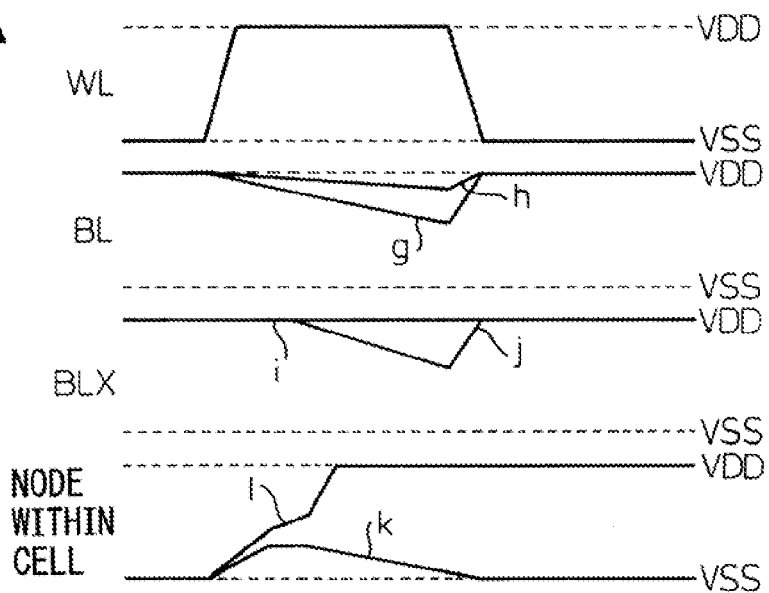
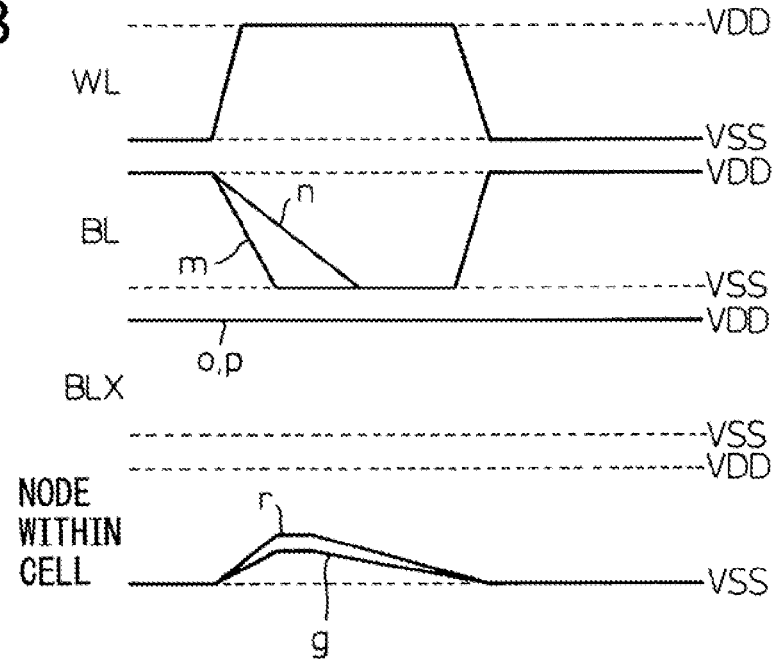

STATIC RAM

CROSS-REFERENCE TO RELATED APPLICATIONS

This application is based upon and claims the benefit of priority of the prior Japanese Patent Application No. 2010-260338, filed on Nov. 22, 2010, the entire contents of which are incorporated herein by reference.

FIELD

The embodiment discussed herein is related to static RAM (Random Access Memory).

BACKGROUND

Static RAM (SRAM) is widely used as memory because it does not require the refresh necessary for DRAM (Dynamic Random Access Memory), and therefore, is capable of a fast operation accordingly.

On the other hand, in recent years, reduction in power consumption has been demanded. To realize a memory that consumes a small amount of electric power, it is necessary to reduce the operating voltage. DRAM has such a problem that if the operating voltage is reduced, the charged voltage of a capacitor provided in a memory cell is reduced, and therefore, the refresh operation needs to be performed frequently and it is difficult to reduce the power consumption. Because of this, SRAM is used in this field and reduction in power consumption is performed by reducing the operating voltage of SRAM.

A general SRAM has a plurality of word lines and a plurality of bit line pairs arranged so as to be perpendicular to each other, a plurality of static-type memory cells arranged in correspondence with crossing parts of the plurality of word lines and the plurality of bit line pairs, a plurality of column circuits provided in correspondence with each bit line pair, a row decoder, a column decoder, a word line driver, and a plurality of column switches. Each column circuit has a sense amplifier, a precharge circuit, an equalizer, a keeper circuit, a bit line pair separation switch, etc.

FIG. 1 is a diagram illustrating a configuration of a portion corresponding to one bit line pair of a general SRAM, i.e., a configuration corresponding to one column. Such circuits are provided in the number corresponding to the number of sets of bit line pairs.

As illustrated in FIG. 1, SRAM has a plurality (n+1) of word lines WL0 to WLn extending in parallel in the transverse direction, bit line pairs BL and BLX extending in parallel in the longitudinal direction, a plurality (n+1) of static-type memory cells C0 . . . Cn arranged in correspondence with crossing parts of the plurality of word lines and the bit line pairs, extended bit line pairs RD and RDX provided in correspondence with the bit line pair BL and BLX, transistors Tr and TrX forming connection circuits of the bit line pair BL and BLX and the extended bit line pair RD and RDX, a precharge circuit PC and a keeper circuit KP connected between the bit line pair BL and BLX, and a sense amplifier SA and an equalizer EQ connected between the extended bit line pair RD and RDX.

Each memory cell is a well known static-type memory cell having a flip-flop that interconnects the input and output of two inverters and two transistors provided between two connection nodes of the flip-flop and the bit line pair BL and BLX. The gates of the two transistors are connected to the corresponding word line WL and when a row selection signal is applied to the word line, the transistors are brought into conduction (turned on) and a state where the memory cell is connected to the bit line pair BL and BLX is brought about.

The bit line pair BL and BLX is very long and a number (N+1) of the memory cells C0 . . . Cn are connected thereto. The precharge circuit PC operates when a precharge signal turns to "Low (L)" and precharges the bit line pair BL and BLX to a "High (H)" level and does not operate when PRE is at H (off state). The keeper circuit KP maintains the bit line on the H side of the bit line pair BL and BLX at H. The transistors Tr and TrX are brought into conduction when a column signal COL is at L and enters a cutoff state when the column signal COL is at H. The sense amplifier SA enters the operating state when a sense amplifier activation signal SAE is at H and amplifies the high voltage side of the bit line pair BL and BLX to H and the low voltage side to L and does not operate when SAE is at L (off state). The equalizer EQ has the same configuration as that of the precharge circuit PC and short-circuits the bit line pair BL and BLX to bring them into the H state when an equalize signal EQD is at L and does not operate when the equalize signal EQD is at H (off state).

FIG. 2 is a time chart illustrating a read operation of the SRAM illustrated in FIG. 1. WL0 represents a row selection signal to be applied to the word line WL0 in the 0-th row, BL/BLX represents a voltage of the bit line pair BL and BLX, and RD/RDX represents a voltage of the extended bit line pair RD and RDX, respectively.

As described above, to the bit line pair BL and BLX, a number (n+1) of memory cells are connected and the row selection signal (active at H) is applied to one of the memory cells (here, in the 0-th row) and the two transistors are brought into conduction. In response to this, the voltage of one of the bit line pair BL and BLX drops according to data stored in the memory cell. At this time, the column signal COL is at L, the transistors Tr and TrX are in the conduction state, and the extended bit line pair RD and RDX also changes in the same manner as the bit line pair BL and BLX.

On the other hand, the precharge signal PRE and the equalize signal EQD are at H and the precharge circuit PC and the equalizer EQ enter the off state. The sense amplifier activation signal SAE is at L and the sense amplifier SA is in the off state.

When the voltage of one of the bit line pair BL and BLX and the extended bit line pair RD and RDX drops, the sense amplifier activation signal SAE changes to H. At this time, the row selection signal, the precharge signal PRE, and the column signal COL change to H and the equalize signal EQD is maintained at H.

In response to this, the bit line pair BL and BLX and the extended bit line pair RD and RDX are cut and separated and the voltage of the bit line pair BL and BLX changes to H by the precharge circuit PC. Because the row selection signal changes to L, the memory cell C0 is cut and separated from the bit line pair BL and BLX and maintains a state corresponding to the stored data.

The sense amplifier SA performs amplification so that the low voltage side of the extended bit line pair RD and RDX changes to L and the high voltage side changes to H or is maintained at H. The state where the extended bit line pair RD and RDX has changed is transmitted to an output circuit via the column switch. When outputting of the state of the extended bit line pair RD and RDX to the outside is completed, the sense amplifier activation signal SAE changes to L, the sense amplifier SA enters the off state, the equalize signal EQD changes to L, and the equalizer EQ changes the extended bit line pair RD and RDX to H.

As described above, both the bit line pair BL and BLX and the extended bit line pair RD and RDX turn to H, and a state where the next read may be performed is brought about.

The above is the read operation of a general SRAM.

It is inevitable for the transistor forming the memory cell to vary in the manufacturing process. Depending on the variations in the characteristics of N-channel transistors of two inverters, the amount of amplitude on the side where the bit line pair BL and BLX changes to L differs considerably. In other words, the speed at which one of the bit line pair BL and BLX changes to L differs.

In BL/BLX in FIG. 2, a illustrates a change when the N-channel transistor has excellent characteristics, b illustrates a change when the N-channel transistor has average characteristics, and c illustrates a change when the N-channel transistor has insufficient characteristics, respectively. In RD/RDX in FIG. 2, d illustrates a change when the N-channel transistor has excellent characteristics, e illustrates a change when the N-channel transistor has average characteristics, and f illustrates a change when the N-channel transistor has insufficient characteristics, respectively.

In order for the sense amplifier SA to correctly amplify the voltage on the side where the voltage of the extended bit line pair RD and RDX has dropped to L, it is necessary for a voltage difference between the extended bit line pair RD and RDX to be equal to or more than a predetermined amount. In other words, the voltage of the other of the extended bit line pair RD and RDX is at H, and therefore, it is necessary for the voltage of the other to be equal to or less than a predetermined value. There is no particular problem when the characteristics of the N-channel transistor are excellent, however, when the characteristics of the N-channel transistor are insufficient, it is not possible to change the sense amplifier activation signal SAE to H until the voltage of one of the extended bit line pair RD and RDX becomes a predetermined value or less. Because of this, the time for the voltage of one of the extended bit line pair RD and RDX to become a predetermined value or less determines the read rate.

As described above, in order to reduce power consumption, the operating voltage is reduced, however, the influence of the reduction in the read rate becomes more remarkable as the operating voltage is reduced. Because of this, it is difficult to reduce the operating voltage sufficiently while maintaining a predetermined operation speed.

Further, in SRAM, it is necessary to correctly read data stored in all the memory cells, and therefore, it is necessary to set the read rate in accordance with that of the memory cell of the lowest operation speed. If such a read rate is set, the transistor of the memory cell considerably changes the voltage of either of the bit line pair BL and BLX when reading data from a memory cell having a transistor of the average or excellent characteristics, in other words, the amount of amplitude is increased and power consumption is increased.

It is known to adopt a hierarchical structure of the bit line pair in order to reduce power consumption, however, amplification is performed so as to change the whole bit line pair of a large capacity with a large amplitude, and therefore, it is not possible to sufficiently reduce power consumption.

SUMMARY

According to an aspect of the embodiment, a static RAM includes: a plurality of word lines; a plurality of global bit line pairs; a plurality of static-type memory cells provided in correspondence with crossing parts of the plurality of word lines and the plurality of global bit line pairs; a plurality of sense amplifiers provided in correspondence with each global bit line pair; a plurality of local bit line pairs provided in correspondence with each global bit line pair; and a plurality of global switches connecting each local bit line pair to the corresponding global bit line pair in response to a global row selection signal, wherein the plurality of static-type memory cells is connected to the corresponding local bit line pair in response to a row selection signal applied to the corresponding word line, and at the time of read, the row selection signal is applied to the word line corresponding to a memory cell to be selected and after the corresponding local bit line pair is brought into a state corresponding to contents stored in the memory cell, application of the row selection signal is stopped and then the corresponding global switch is brought into a connection state by applying the global row selection signal and after changing the state of the global bit line pair according to the state of the local bit line pair, the corresponding sense amplifier is operated.

The object and advantages of the embodiment will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 7A and 7B are time charts for explaining the effect of improvement in poor stability.

EMBODIMENT

Figure 3:
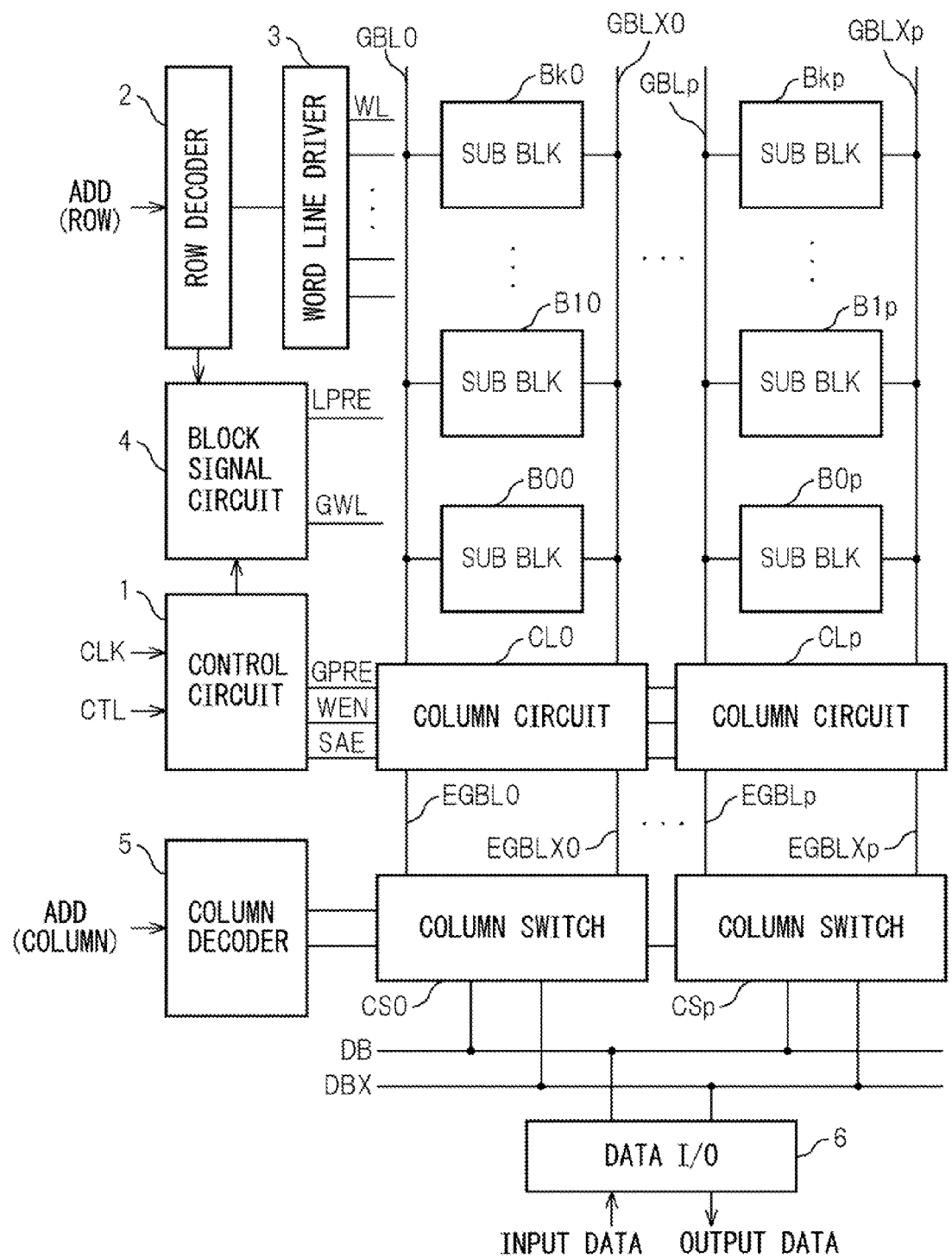
FIG. 3 is a diagram illustrating a general configuration of SRAM in an embodiment.

FIG. 3 is a diagram illustrating a general configuration of SRAM in an embodiment.

The SRAM in the embodiment has a control circuit 1, a row decoder 2, a word line driver 3, a block signal circuit 4, a column decoder 5, a plurality of column switches CS0 to CSp, a data I/O circuit 6, a plurality ((k+1)×(m+1)) of word lines WL, a plurality (p+1) of global bit line pairs GBL0 and GBLX0 to GBLp and GBLXp, a plurality (p+1) of extended global bit line pairs EGBL0 and EGBLX0 to EGBLp and EGBLXp, a plurality ((k+1)×(p+1)) of sub blocks (SUB BLK) B00 to Bkp arranged in correspondence with the plurality of word lines, and a plurality of column circuits CL0 to CLp provided in correspondence with each bit line pair. As described above, the SRAM in the embodiment has a hierarchical structure in which a plurality of short local bit line pairs is connected to long global bit line pairs.

The control circuit 1 generates an operation control signal to be supplied to each part within the SRAM based on a clock CKL and a control signal CTL supplied from the outside. The control signal CTL includes, for example, a read signal, a write signal, etc. The operation control signal includes a write enable signal WEN, the sense amplifier activation signal SAE, a global precharge signal GPRE, an internal clock, etc. The operation control signal is supplied also to the row decoder 2, the column decoder 5, the block signal circuit 4, etc. The row decoder 2 receives the row address portion ADD (ROW) of an address signal in synchronization with the clock CKL and supplies a word line selection signal to the word line driver 3. The row decoder 2 further supplies a signal obtained by decoding the row address portion of the address signal to the block signal circuit 4. The word line driver 3 applies a row selection signal (H active) to a word line corresponding to the word line selection signal. The block signal circuit 4 outputs a local precharge signal LPRE and a global connection signal GWL to the sub block to which the word line is connected, to which word line the row selection signal is applied. The column decoder 5 receives the column address portion ADD (COLUMN) of the address signal in synchronization with the clock CLK and supplies a column selection signal to the column switches CS0 to CSp. The data I/O circuit 6 receives input data to be written from the outside and outputs the read output data to the outside. The column switch selected by the column selection signal supplies input data from the data I/O circuit 6 to the column circuit at the time of write and supplies data read from the column circuit to the data I/O circuit at the time of read. The SRAM in the embodiment performs the same operation as the normal write operation at the time of write, and therefore, explanation of only the read operation is given below.

Figure 4:
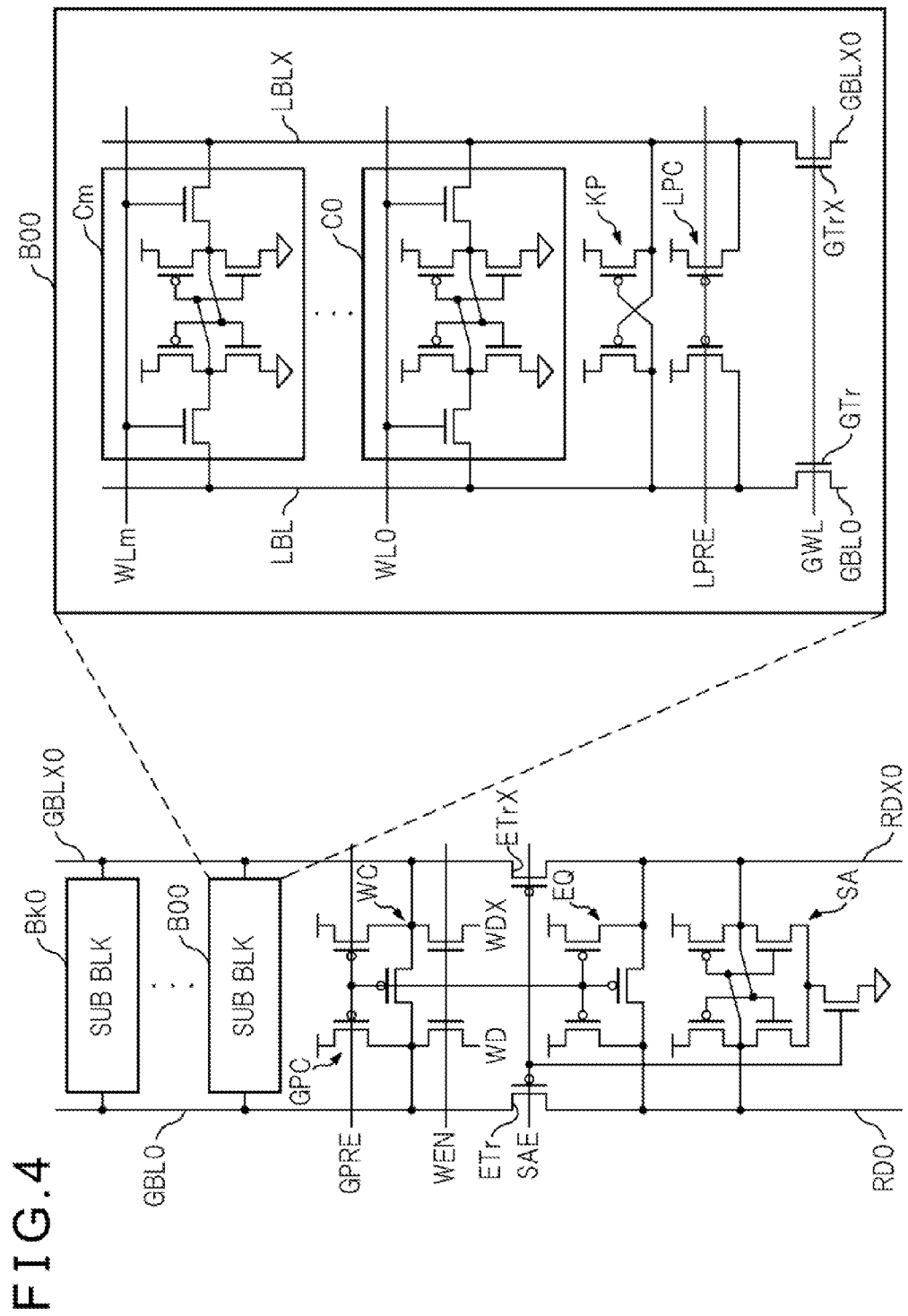
FIG. 4 is a diagram illustrating details of a sub block, a global bit line pair, a column circuit, and an extended global bit line pair of the first column of SRAM in an embodiment.

FIG. 4 is a diagram illustrating details of the sub blocks B00 to Bk0, the global bit line pair GBL0 and GBLX0, the column circuit CL0, and the extended global bit line pair EGBL0 and EGBLX0 in the first column of the SRAM in the embodiment. Such a circuit as in FIG. 4 is provided for each column, that is, for each global bit line pair.

Between the global bit line pair GBL0 and GBLX0, a plurality (k+1) of the sub blocks (SUB BLK) B00 to Bk0 is connected. Each sub block has the same configuration.

The sub block B00 has a local bit line pair LBL and LBLX provided in parallel, a plurality (m+1) of memory cells C0 to Cm connected between the local bit line pair, a local precharge circuit LPC and a keeper circuit KP connected between the local bit line pair, and global connection transistors GTr and GTrX forming connection circuits of the local bit line pair LBL and LBLX and the global bit line pair GBL0 and GBLX0.

Each memory cell is a well known static-type memory cell having a flip-flop that interconnects the input and output of two inverters and two transistors provided between two connection nodes of the flip-flop and the local bit line pair LBL and LBLX. The gates of the two transistors are connected to the corresponding word line WL and the two transistors are brought into conduction (turned on) when the row selection signal is applied to the word line and a state where the memory cell is connected to the local bit line pair LBL and LBLX is brought about.

When the local precharge signal LPRE turns to L, the local precharge circuit LPC operates and precharges the local bit line pair LBL and LBLX to H and does not operate when LPRE is at H (off state). The keeper circuit KP maintains the bit line on the H side of the bit line pair BL and BLX at H. The global connection transistors GTr and GTrX are brought into conduction when the global connection signal GWL output from the block signal circuit 4 is at H and enters a cutoff state when the block selection signal GWL is at L.

The column circuit CL0 has a global precharge circuit GPC, a write circuit WC, extended connection transistors ETr and ETrX, an equalizer EQ, and a sense amplifier SA.

The global precharge circuit GPC is connected between the global bit line pair GBL0 and GBLX0 and operates to precharge the global bit line pair GBL0 and GBLX0 to H when the global precharge signal GPRE turns to L and does not operate when GPRE is at H.

The write circuit WC operates when the write signal WEN output from the control circuit 1 is at H and sets WD and WDX to H and L or to L and H according to the write data and brings the global bit line pair GBL0 and GBLX0 into a state according to the write data. The local bit line pair LBL and LBLX changes into a state according to the state of the global bit line pair GBL0 and GBLX0 via the global connection transistors GTr and GTrX. Then, the memory cell to be written is connected to the local bit line pair LBL and LBLX and enters a state according to the write data. The write operation of the present embodiment is the same as that of a general SRAM having a hierarchical structure of a bit line pair, and therefore, more explanation is omitted.

The extended connection transistors ETr and ETrX form connection circuits of the global bit line pair GBL0 and GBLX0 and extended bit line pair RD0 and RDX0 provided in correspondence with the global bit line pair GBL0 and GBLX0. The extended connection transistors ETr and ETrX are brought into conduction (turned on) when the sense amplifier activation signal SAE output from the control circuit 1 is at L and are cut off (turned off) when the sense amplifier activation signal SAE is at H.

The sense amplifier SA enters the operating state when the sense amplifier activation signal SAE output from the control circuit 1 is at H and amplifies the high voltage side of the extended bit line pair RD0 and RDX0 to H and the low side to L and does not operate when SAE is at L (off state). The equalizer EQ short-circuits the bit line pair RD0 and RDX0 to bring them into the H state when the global precharge signal GPRE is at L and does not operate when the equalize signal EQD is at H (off state).

Figure 5:
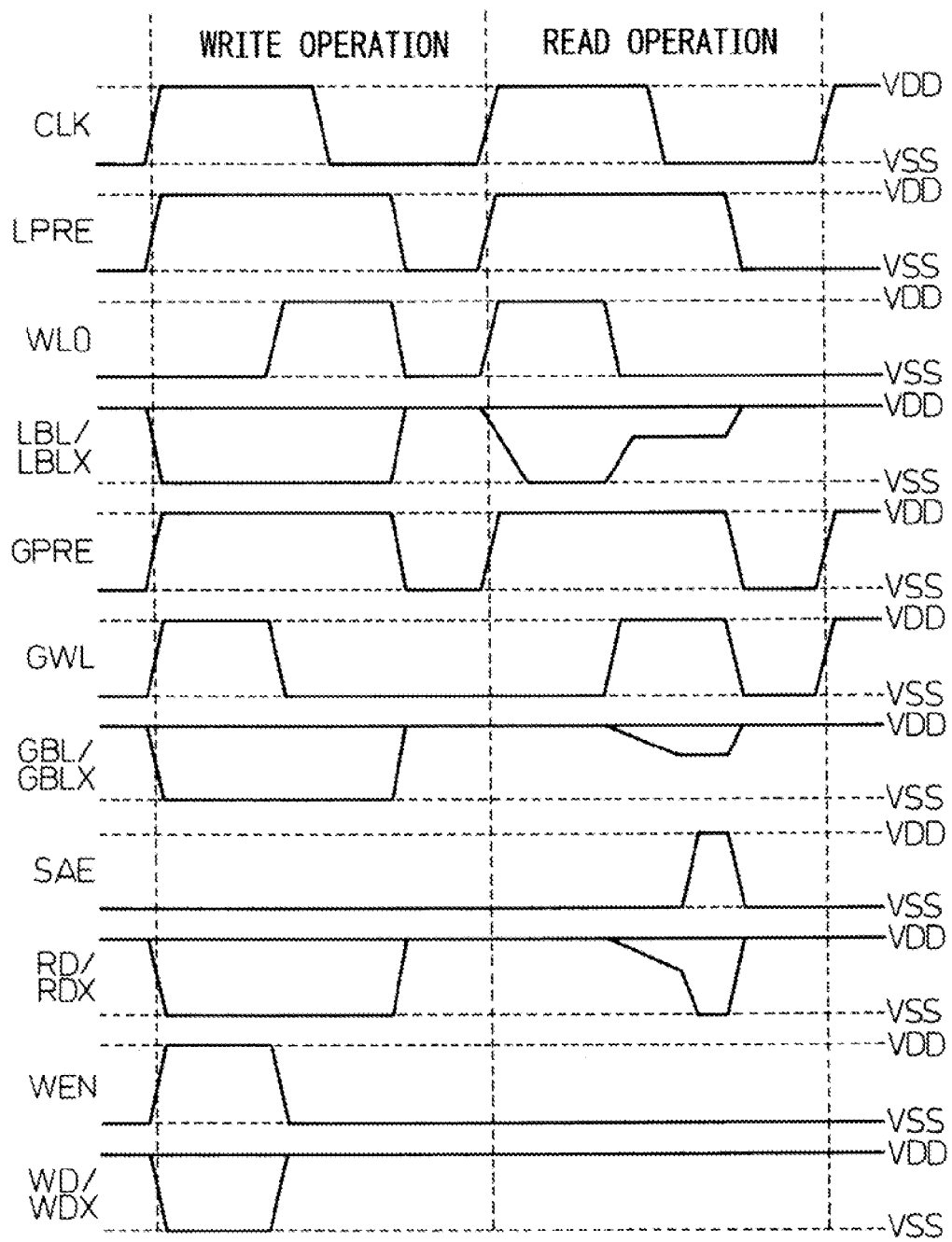
FIG. 5 is a time chart illustrating an operation of SRAM in an embodiment.

FIG. 5 is a time chart illustrating the operation of the SRAM in the embodiment. The operation is performed in synchronization with the clock CLK. First, the read operation is explained, however, during the read operation, the write circuit WC is in the off state, and therefore, the operation of the write circuit WC is not explained. A case is explained, where the memory cell C0 is accessed and stored data is read, however, the opposite case is also the same. It is assumed that the node of the memory cell C0, which is connected to the local bit line LBL, is in the L (VSS) state and the node connected to LBLX is in the H (VDD) state.

Before CLK rises, LBL, LBLX, GBL0, GBLX0, RD0, and RDX0 are reset to H.

In synchronization with the rise of CLK, LPRE and GPRE change to H and at the same time, a row selection signal is applied to the word line WL0 and WL0 changes to H. At this time, GWL, SAE, and WEN are at L. LPRE and GPRE turn to H, and therefore, the local precharge circuit LPC, the global precharge circuit GPC, and the equalizer enter the off state. Because GWL is at L, GTr and GTrX are in the off state. Further, because SAE is at L, the sense amplifier SA is in the off state and ETr and ETrX are in the conduction state.

Because WL0 changes to H, the connection transistor of the memory cell C0 is brought into conduction and the node in the L state is connected to LBL and the node in the H state to LBLX. Because the N-channel transistor of the memory cell C0 connected to LBL is in conduction, LBL changes down to L (VSS). After that, the application of the row selection signal is stopped and in synchronization with WL0 turning to L, GWL changes to H. In response to this, the local bit line LBL in the L state and the global bit line GBL0 and the extended global bit line RD0 in the H state are connected, resulting in the occurrence of charge share and the voltage of the global bit line GBL0 and the extended global bit line RD0 drops by an amount corresponding to the ratio of capacitance to the local bit line. At the same time, the voltage of the local bit line LBL rises due to the charge share. The local bit line LBLX, the global bit line GBLX0, and the extended global bit line RDX0 are all at H and therefore do not change.

After the voltage of the global bit line GBL0 and the extended global bit line RD0 drops, the sense amplifier activation signal SAE changes to H. Due to this, the extended global bit line pair RD0 and RDX0 is cut and separated from the global bit line pair GBL0 and GBLX0. The local bit line pair LBL and LBLX and the global bit line pair GBL0 and GBLX0 maintain the connection state. Consequently, the local bit line pair LBL and LBLX and the global bit line GBL0 and GBLX0 maintain the voltage at that time.

Because the sense amplifier activation signal SAE changes to H, the sense amplifier SA operates to change the voltage of the extended global bit line RD0 to L. The voltage of the extended global bit line RDX0 is maintained at H. The column switch CS0 outputs the state of the extended global bit line pair RD0 and RDX0 from the data I/O 6 via buses DB and DBX.

After that, the sense amplifier activation signal SAE changes to L and at the same time, LPRE and GPRE change to L. In response to this, the sense amplifier SA enters the off state and LPC, GPC, and EQ initialize the local bit line pair LBL and LBLX, the global bit line pair GBL0 and GBLX0, and the extended global bit line pair RD0 and RDX0 to H. This brings about a state where the next read operation may be performed.

In FIG. 5, the operation at the time of write is also illustrated, however, the operation at the time of write is the same as the write operation of the SRAM having a normal hierarchical bit line structure, and therefore, its explanation is omitted.

In the present embodiment, as to the amount of change in voltage accompanying the read of the global bit line pair GBL0 and GBLX0 and the extended global bit line pair RD0 and RDX0, the amount of amplitude is determined by the capacitance ratio to the local bit line pair LBL and LBLX. The capacitance of the local bit line pair LBL and LBLX is comparatively small. Because of this, even when there are variations in the characteristics of the N-channel transistor of the memory cell, it is possible to change the local bit line pair LBL or LBLX to L in a brief time, and therefore, it is not affected by the variations in the characteristics of the N-channel transistor of the memory cell. Consequently, it is possible to suppress the amount of amplitude of the bit line and to reduce electric power.

The effect that may be obtained in the present embodiment is explained in more detail. First, the effect to reduce electric power is explained.

When a hierarchical bit line structure is used as in the present embodiment, normally, the sum of the charge/discharge electric power of the local bit line pair LBL and LBLX and the charge/discharge electric power of the global bit line pair GBL0 and GBLX0 and the extended global bit line pair RD0 and RDX0 equals electric power to read an amount corresponding to one bit of the SRAM.

However, in the present embodiment, it is made possible to eliminate the charge/discharge electric power of the global bit line pair GBL0 and GBLX0 and the extended global bit line pair RD0 and RDX0. This is explained with reference to the time chart in FIG. 6.

Figure 6:
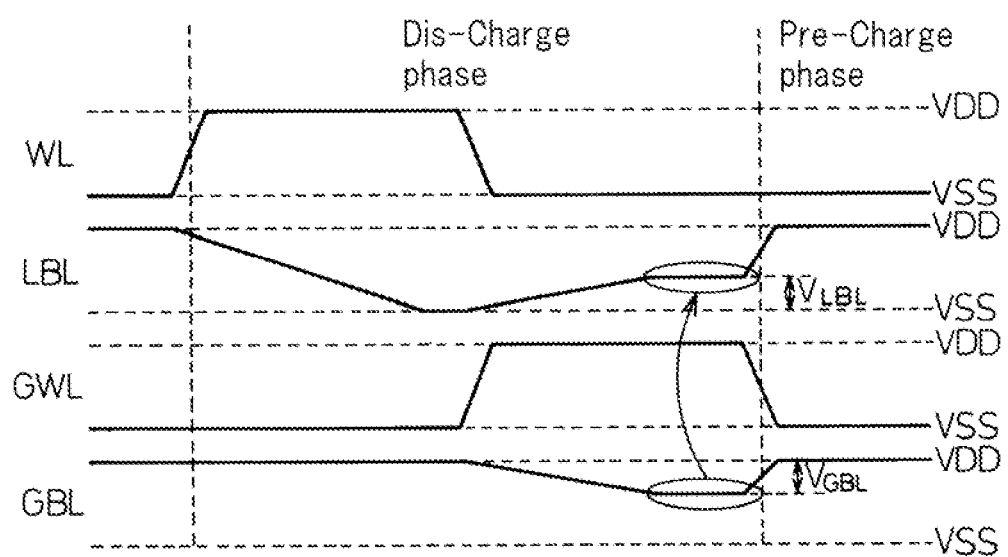
FIG. 6 is a diagram illustrating part of the time chart in FIG. 5 in an enlarged view.

FIG. 6 is a diagram illustrating part of the time chart in FIG. 5 in an enlarged view. A discharge phase is a phase in which the global bit line pair GBL0 and GBLX0 is brought into a state corresponding to the data stored in the memory cell and a precharge phase is a phase in which the global bit line pair GBL0 and GBLX0 etc. are brought into the H state.

In the present embodiment, a row selection signal is applied to the word line to bring the connection transistor of the memory cell into conduction and the voltage of one of the local bit lines LBL and LBLX is lowered down to L (VSS). After that, the application of the row selection signal is stopped to cut off the connection transistor and one of the local bit lines LBL and LBLX is brought into the L and floating state. After that, GWL is turned to H to bring GTr and GTrX into conduction, charge share is caused to occur between the local bit line pair LBL and LBLX, and the global bit line pair GBL0 and GBLX0 and the extended global bit line pair RD0 and RDX0, and the voltage of the global bit line pair GBL0 and GBLX0 and the extended global bit line pair RD0 and RDX0 is amplified. The change in voltage at this time does not consume electric power because part of charges (corresponding to $V_{GBL}$) gathered in the global bit line pair GBL0 and GBLX0 and the extended global bit line pair RD0 and RDX0 are only transferred to the local bit line pair LBL and LBLX. At this time, the voltage of the local bit line pair LBL and LBLX rises by an amount corresponding to $V_{LBL}$. FIG. 6 illustrates that the charges of GBL have moved to LBL.

As described above, after performing the operation in the discharge phase, the local bit line pair LBL and LBLX, the global bit line pair GBL0 and GBLX0, and the extended global bit line pair RD0 and RDX0 are precharged to H (VDD) in the precharge phase. The amount of charge at this time is an amount corresponding to VDD-$V_{LBL}$ in the local bit line LBL and an amount corresponding to $V_{GBL}$ in the global bit line GBL and the extended global bit line RD0. The amount of charge at the time of precharge is the same as that when the local bit line LBL is charged from VSS to VDD. Consequently, the global bit line GBL consumes electric power neither in the discharge phase nor in the precharge phase.

Figure 1:
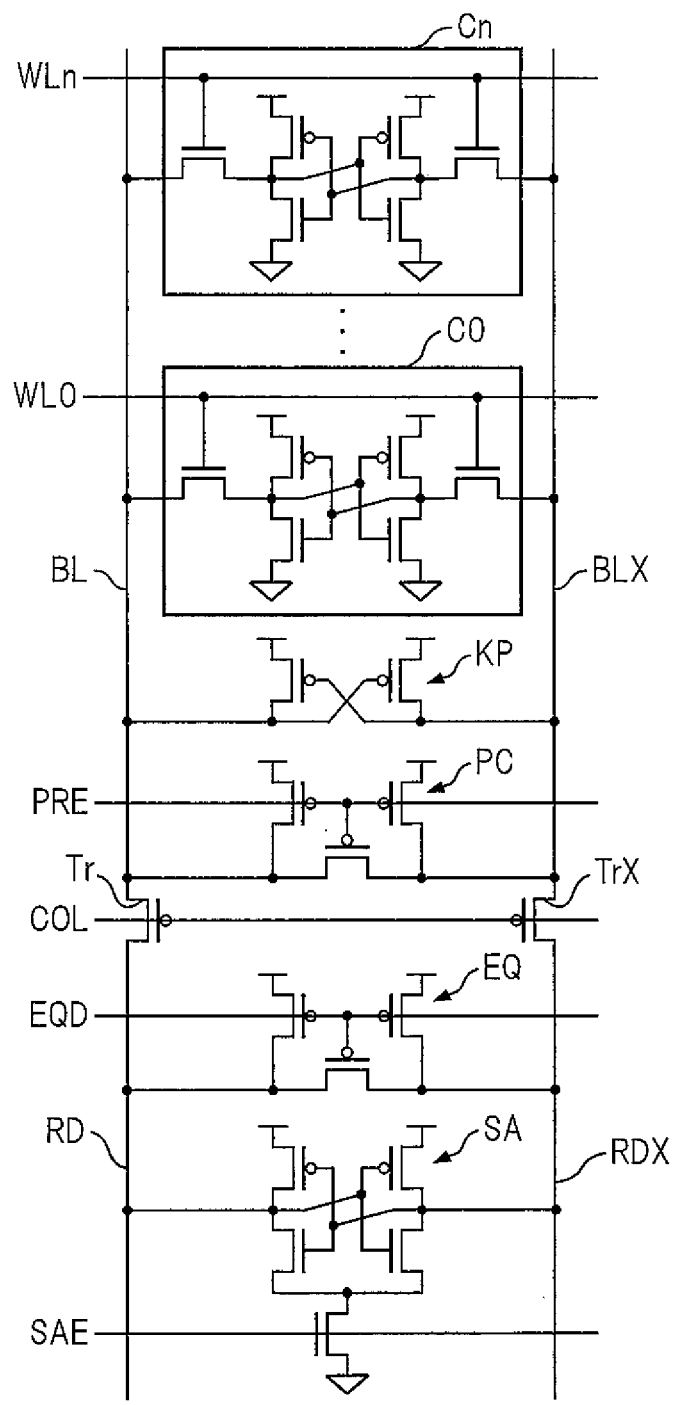
FIG. 1 is a diagram illustrating a portion corresponding to one bit line pair of a general SRAM, that is, a configuration corresponding to one column.
Figure 2:
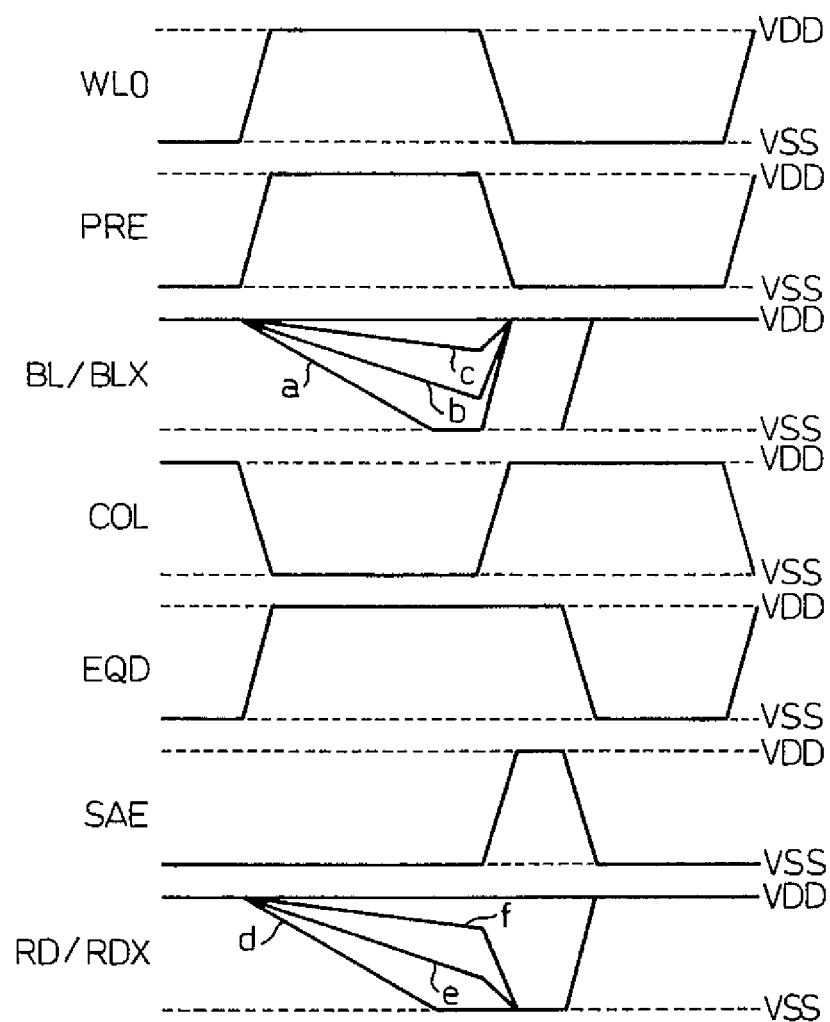
FIG. 2 is a time chart illustrating a read operation of the SRAM illustrated in FIG. 1.

Next, the electric power reduction effect of the SRAM having the general circuit configuration illustrated in FIG. 1 and the SRAM in the present embodiment is explained.

The power consumption is expressed by expression $P=CV^2$. When the bit line pair capacitance corresponding to one memory cell is assumed to be $C_{BL}$, the capacitance of the bit line pair BL is obtained by number of rows×number of columns×$C_{BL}$. At the time of read, if the average bit line amplitude amount=VDD/2, the number of rows=128, and the number of columns=4, the power consumption when reading an amount corresponding to one bit of the SRAM in FIG. 1 is obtained as follows.

Power consumption when reading circuit in FIG. 1=4× 128×$C_{BL}$×0.5×VDD$^2$=256×$C_{BL}$×VDD$^2$.

Next, the power consumption when reading an amount corresponding to one bit of the SRAM in the present embodiment is explained.

As described above, in the present embodiment, the global bit line pair GBL0 and GBLX0 does not consume electric power, and therefore, it is preferable to take into consideration only electric power in the local bit line pair LBL and LBLX. In FIG. 4, if it is assumed that k=8, m=16, the power consumption when the number of rows of the local bit line=16 and the number of columns=4 is obtained as follow.

Power consumption at the time of read in the present embodiment=4×16×$C_{BL}$×VDD$^2$=64×$C_{BL}$×VDD$^2$.

Consequently, in the present embodiment, it is possible to reduce the power consumption when reading the general SRAM in FIGS. 1 to 1/4.

Next, the effect of improvement in poor stability is explained with reference to FIGS. 7A and 7B. FIG. 7A illustrates a case of the general SRAM illustrated in FIG. 1 and FIG. 7B illustrates a case of the SRAM in the present embodiment. In FIG. 7A, g and k represent a case where the characteristics of the transistor of the memory cell are normal and h and l represent a case where the characteristics of the transistor of the memory cell are poor. In FIG. 7B, m and q represent a case where the characteristics of the transistor of the memory cell are normal and n and r represent a case where the characteristics of the transistor of the memory cell are poor.

As illustrated in FIG. 7A, in the case of the general SRAM, the capacitance of the bit line BL is large, in other words, a large number of memory cells are connected to BL, and therefore, the voltage of the bit line BL drops only gradually. Because of this, when reading data from the memory cell the characteristics of which are poor, the voltage of the bit line does not drop sufficiently and remains in a state close to VDD. In an advanced process applied to manufacture of SRAM etc., there may occur a case where erroneous read is performed because the values of the cell are inverted depending on the balance of the six transistors within the memory cell because random variations are very large.

In contrast to this, in the present embodiment, as illustrated in FIG. 7B, the bit line LB drops down to VSS before the values of the memory cell are inverted, and therefore, erroneous read may be prevented. This is because the number of memory cells connected to the bit line BL is small and the wiring length is short, and therefore, the capacitance is small. Because the bit line BL drops down to VSS before the inversion, data L is written back to the memory cell, and therefore, the poor stability is reduced and reliability is improved.

According to the embodiment, SRAM that has reduced power consumption while maintaining the operation speed, and thereby reliability is realized.

In the above explanation, it is assumed that the column circuits provided in correspondence with the plurality of global bit line pairs operate at the same time, however, it is also possible to operate a column circuit in a column to which the target memory cell belongs.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiment of the present invention have been described in detail, it should be understood that the various changes, substitutions, and alterations could be made hereto without departing from the spirit and scope of the invention.

What is claimed is:

1. A static RAM comprising:
a plurality of word lines;
a plurality of global bit line pairs, each one of the plurality of global bit line pairs being divided into a main global bit line pair and an extended global bit line pair;
a plurality of static-type memory cells provided in correspondence with crossing parts of the plurality of word lines and the plurality of main global bit line pairs;
a plurality of sense amplifiers each of the plurality of sense amplifiers being connected between each one of the plurality of the extended global bit line pairs;
a plurality of local bit line pairs provided in correspondence with each one of the plurality of the main global bit line pairs; and
a plurality of global switches each of the plurality of global switches connecting each one of the plurality of local bit line pairs to a corresponding one of the plurality of the main global bit line pairs in response to a global row selection signal,
a plurality of bit line pair connection switches each of the plurality of bit line pair connection switches switching the connection state of each one of the plurality of main global bit line pairs and each one of the plurality of extended global bit line pairs, wherein
each one of the plurality of static-type memory cells is connected to a corresponding local bit line pair in response to a row selection signal applied to a corresponding word line, and
at a time of read, one of the plurality of bit line pair connection switches is brought into conduction, a row selection signal is applied to a word line corresponding to a memory cell to be selected and after corresponding one of the plurality of local bit line pairs is brought into a state corresponding to contents stored in the memory cell, application of the row selection signal is stopped and then corresponding one of the plurality of global switches is brought into a connection state by applying a corresponding global row selection signal and changing states of a main global bit line pair and an extended global bit line pair according to the state of the corresponding local bit line pair,
bringing the bit line pair connection switch into a cutoff state, and a corresponding sense amplifier is operated.

2. The static RAM according to claim 1, further comprising a plurality of precharge circuits each of the plurality of precharge circuits provided in correspondence with each one of the plurality of global bit line pairs, wherein
the operation of the corresponding sense amplifier is stopped, the plurality of global switches and the plurality of bit line pair connection switches are brought into conduction, and the plurality of precharge circuits change the plurality of main global bit line pairs, the plurality of extended global bit line pairs, and the plurality of local bit line pairs into an initial state.

\* \* \* \* \*